United States Patent
Jiao

(10) Patent No.: US 8,689,438 B2
(45) Date of Patent: Apr. 8, 2014

(54) SEAL APPARATUS AND METHOD OF MANUFACTURING THE SAME

(75) Inventor: Jinbao Jiao, Buffalo Grove, IL (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 18 days.

(21) Appl. No.: 13/297,974

(22) Filed: Nov. 16, 2011

(65) Prior Publication Data

US 2012/0061919 A1 Mar. 15, 2012

Related U.S. Application Data

(62) Division of application No. 12/190,813, filed on Aug. 13, 2008, now Pat. No. 8,125,784.

(51) Int. Cl.
| | |
|---|---|
| *H01R 43/00* | (2006.01) |
| *H05K 13/00* | (2006.01) |
| *H05K 3/10* | (2006.01) |
| *H05K 3/02* | (2006.01) |

(52) U.S. Cl.
USPC .................... 29/858; 29/846; 29/856; 29/857

(58) Field of Classification Search
USPC ............ 29/858, 846, 856, 857; 265/614, 619; 156/349
See application file for complete search history.

(56) References Cited

U.S. PATENT DOCUMENTS

| | | | | |
|---|---|---|---|---|
| 3,541,044 A | * | 11/1970 | Beers et al. ................. | 524/847 |
| 4,048,670 A | * | 9/1977 | Eysermans ................. | 361/813 |
| 4,356,116 A | * | 10/1982 | Beers ........................... | 524/837 |
| H073 H | * | 6/1986 | Claasen et al. .............. | 257/669 |
| 4,735,979 A | * | 4/1988 | Beers et al. .................. | 524/188 |
| 5,523,608 A | * | 6/1996 | Kitaoka et al. ............... | 257/433 |
| 6,103,804 A | * | 8/2000 | Davis ........................... | 524/431 |
| 6,111,198 A | * | 8/2000 | Tower ........................ | 174/50.56 |
| 6,353,257 B1 | * | 3/2002 | Huang ......................... | 257/704 |
| 6,413,354 B1 | * | 7/2002 | Haas et al. .................. | 156/329 |
| 6,545,332 B2 | * | 4/2003 | Huang ......................... | 257/433 |
| 6,958,123 B2 | * | 10/2005 | Reid et al. ....................... | 216/2 |
| 7,195,940 B2 | * | 3/2007 | Bolken et al. ................. | 438/25 |
| 7,202,602 B2 | * | 4/2007 | Anandan ..................... | 313/512 |
| 7,387,902 B2 | * | 6/2008 | Bolken et al. .................. | 438/5 |
| 7,410,836 B2 | * | 8/2008 | Huang ......................... | 438/124 |
| 7,419,854 B2 | * | 9/2008 | Bolken et al. ................ | 438/116 |
| 7,456,500 B2 | * | 11/2008 | Kromotis et al. ............ | 257/725 |
| 7,776,640 B2 | * | 8/2010 | Chuang et al. ................ | 438/64 |
| 7,982,298 B1 | * | 7/2011 | Kang et al. .................. | 257/686 |
| 8,125,063 B2 | * | 2/2012 | Wang ............................ | 257/676 |
| 2004/0127669 A1 | * | 7/2004 | Ueno et al. ...................... | 528/25 |
| 2006/0169490 A1 | * | 8/2006 | Bolken et al. ................ | 174/521 |

* cited by examiner

*Primary Examiner* — David Angwin

(57) ABSTRACT

A seal includes a housing with an exterior surface. The housing forms a cavity extending from the exterior surface into the housing and defines at least one slanted interior surface. The at least one slanted interior surface extends from the exterior surface of the housing and is in a substantially non-perpendicular and angled relation to the exterior surface of the housing. The seal also includes at least one electrical lead that extends through the housing and has a portion exposed across the cavity therein. The at least one electrical lead extends from the housing and is configured to be in electrical contact with at least one electrical component encased within the electronic control housing. The seal also includes an adhesive material that substantially fills the cavity and surrounds the exposed portion of the at least one electrical lead exposed across the cavity.

6 Claims, 3 Drawing Sheets

SEAL APPARATUS AND METHOD OF MANUFACTURING THE SAME

CROSS-REFERENCE TO RELATED APPLICATIONS

This application is a divisional of U.S. patent application Ser. No. 12/190,813, filed on Aug. 13, 2008, which is incorporated herein by reference in its entirety.

FIELD OF THE INVENTION

The field of the invention relates to seals and, more specifically, to seals used in transmission systems.

BACKGROUND

Electronic devices are often used in today's vehicular transmission systems. For example, electronic devices may be used to control the operation of transmission systems in order to achieve improved performance of the vehicle for the user. The electronic devices are typically disposed within a housing in the transmission and this housing is usually either partially or completely submerged in a fluid (e.g., a transmission fluid). One or more electric leads typically enter the housing, for example, to supply power or carry control signals to or from the electronic devices residing within the housing, or to or from other components outside the housing.

The problem of fluid leakage is often encountered with respect to the above-mentioned housings in previous systems. More specifically, when the housing is submerged in a fluid, the fluid may enter the interior of the housing and reach the electronic devices disposed therein. If the fluid reaches the electronic devices, the electronic devices may become disabled or may malfunction, thereby disabling the system or creating performance problems for the vehicle. The problem of fluid leakage into the housing holding the electronic devices is particularly troublesome at the entry points for the electric leads that have been mentioned above.

In an attempt to correct the problem of fluid leaking into the housing around the entry points of the electric leads, previous systems have utilized a seal associated with the leads. More particularly, these previous systems have employed a sealing cell or cavity that is formed about the leads near where they enter the housing. After the sealing cell or cavity is formed, an adhesive is applied into the sealing cell or cavity in an attempt to prevent fluid entry into the housing.

Unfortunately, these previous approaches have not adequately prevented liquids from entering the housings. More specifically, fluids still entered the housings at various places in the sealing cell despite the use of sealing cell or cavity. This leakage was typically caused by the debonding of the adhesive from the walls of the sealing cell that was, in turn, caused by thermal stress, or by some defect (e.g., a void) introduced when the adhesive was encapsulated into the sealing cell or cavity.

Consequently, previous approaches have proved inadequate in preventing fluid from entering the housings of previous transmission systems where electronic components are housed. This problem has, in turn, caused many transmission systems to fall into non-compliance with various consumer specifications/requirements. Additionally, the fluid leakage problem present in previous systems has frequently led to the malfunction and/or inoperability of these transmission systems causing user frustration and inconvenience.

Figure 1:
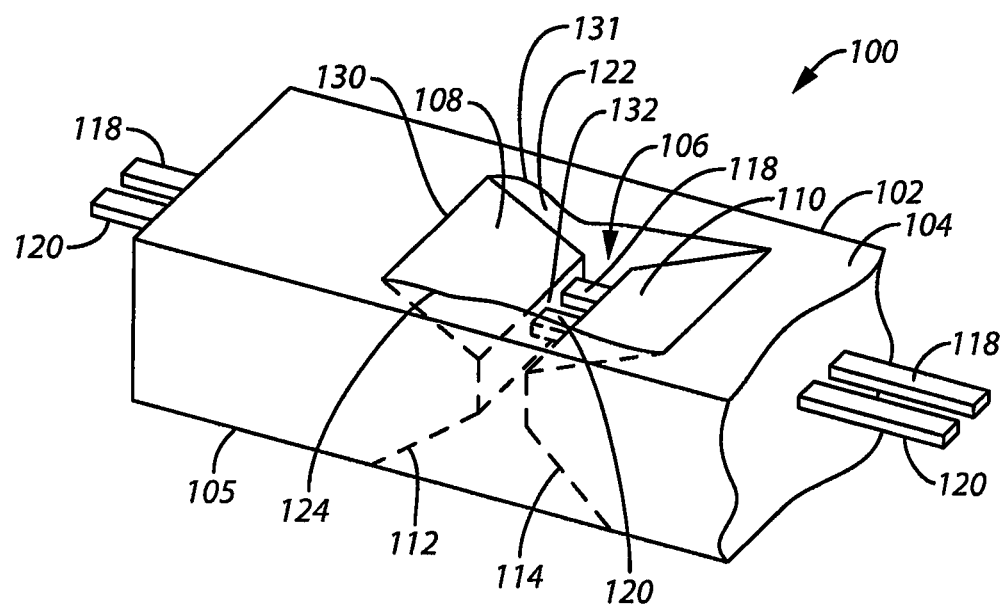
FIG. 1 comprises a perspective view of a seal according to various embodiments of the present invention.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention. It will further be appreciated that certain actions and/or steps may be described or depicted in a particular order of occurrence while those skilled in the art will understand that such specificity with respect to sequence is not actually required. It will also be understood that the terms and expressions used herein have the ordinary meaning as is accorded to such terms and expressions with respect to their corresponding respective areas of inquiry and study except where specific meanings have otherwise been set forth herein.

DETAILED DESCRIPTION

Seals for electrical leads in electronic transmission systems and approaches for manufacturing these seals are provided. The seals provided herein substantially reduce or eliminate the intrusion of fluids into electronic housings in transmission systems. The approaches described herein are easy to manufacture, cost-effective to implement, and substantially reduce or eliminate fluid intrusion into electronic housings used in transmission systems. The effects of thermal stress or defects of the adhesives used to form the seal are ameliorated. Consequently, malfunctions or inoperability of electronic components due to fluid intrusion is significantly reduced or eliminated. User satisfaction with vehicular performance is enhanced.

In many of these embodiments, a seal for preventing the entry of fluid into an electronic control housing in a transmission system is provided. The seal includes a housing and the housing has an exterior surface. The housing forms a cavity extending from the exterior surface into the housing and the housing defines one or more slanted interior surfaces. The one or more slanted interior surfaces extend from the exterior surface of the housing and are configured in a substantially non-perpendicular and angled relation to the exterior surface of the housing. The seal also includes one or more electrical leads that extend through the housing and have a portion exposed across the cavity therein. The one or more electrical leads extend from the housing and are configured to be in electrical contact with one or more electrical components encased within the electronic control housing. The seal also includes an adhesive material that substantially fills the cavity and surrounds the exposed portion of the electrical leads within the cavity.

The adhesive material may be composed of a variety of different materials. For example, the adhesive material may be an epoxy and a fluorocarbon. Other examples of adhesive materials are possible.

The one or more slanted surfaces may take on a number of forms, shapes, configurations, and dimensions. In one example, the slanted surface is further formed of a plurality of individual step portions. In another example, the slanted surface is formed with a wave-like pattern. Other examples of configurations for the slanted surface are possible.

In other examples, the cavity further defines a side surface and the side surface is configured and disposed to be in substantially perpendicular relation and in communication with the exterior surface and in substantially parallel relation to the electrical leads. In one approach, the side surface is formed with a wave-like pattern. However, it will be appreciated that the side surface may be formed according to other patterns or configurations.

The seals described herein may be placed at different locations with respect to the housing. In some examples, the seal is configured to be disposed within the electronic control housing of the transmission system. Alternatively, in other examples, the seal is configured to be disposed outside of and communicate with the electronic control housing of the transmission system. Other examples of placements for the seal are possible.

In others of these embodiments, a transmission assembly includes an electronic control housing and the electronic control housing has at least one electronic control component disposed therein. The assembly also includes a seal that is in communication with the electronic control housing. The seal has an exterior surface and forms a cavity extending into the seal. The cavity defines one or more slanted interior surfaces and the interior surfaces extend from the exterior surface and are in a substantially non-perpendicular and angular relation to the exterior surface.

The assembly also includes one or more electrical leads that extend through the seal and have a portion exposed across the cavity therein. The electrical leads extend from the seal and are coupled to the electronic control components. An adhesive material substantially fills the cavity and surrounds the exposed portion of the electrical leads within the cavity of the seal.

In others of these embodiments, one or more electrical leads are formed. A housing is molded at least partially around the electrical leads and the housing is formed with an exterior surface. A cavity is formed in the housing and the cavity extends into the housing from the exterior surface. The cavity defines one or more slanted interior surfaces and the slanted interior surfaces extend from the exterior surface and are in a substantially non-perpendicular and angled relation to the exterior surface. The cavity is formed so as to expose a portion of the electrical leads within the cavity. The cavity is filled with an adhesive material and the adhesive material substantially fills the cavity and surrounds the exposed portion of the electrical leads.

In other examples, the adhesive material is cured. This may be performed by applying heat to the material. For example, the adhesive material may be heated in an oven at a temperature of 140 degrees Celsius for a period of one hour. Other examples of curing temperatures and time periods may be used.

In still other examples, the cavity is formed so as to extend completely through the housing. A block may be placed beneath the housing before filling the cavity. The block is used to prevent adhesive from leaking through the cavity during manufacturing.

Thus, seals for electrical leads in electronic transmission systems and approaches for manufacturing these seals are provided. The seals provided herein substantially reduce or eliminate the intrusion of fluids into electronic housings in transmission systems. The approaches described herein are easy to manufacture, cost-effective to implement, and substantially reduce or eliminate fluid intrusion into housings in transmission systems. Consequently, malfunctions or inoperability of electronic components due to fluid intrusion are significantly reduced or eliminated.

Figure 2:
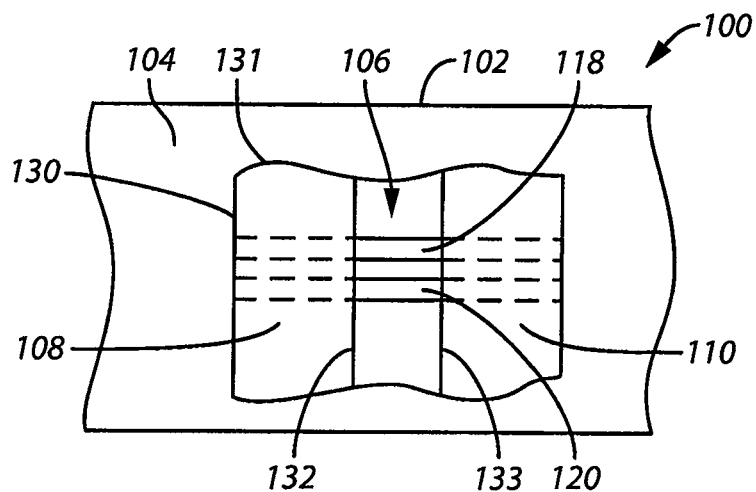
FIG. 2 comprises a top view of a seal of FIG. 1 according to various embodiments of the present invention.
Figure 3A:
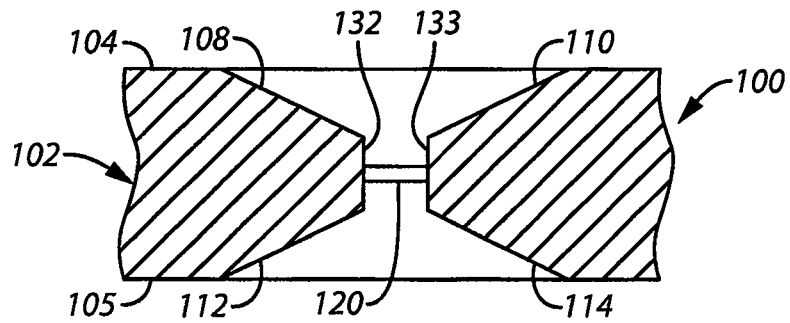
FIGS. 3a comprises a side cut-away view of the seal of FIGS. 1-2 according to various embodiments of the present invention.

Turning now to the figures and referring now to FIGS. 1, 2, and 3a, one example of a seal 100 is described. The seal includes a housing 102 and the housing has a first exterior surface 104 and a second exterior surface 105. The housing 102 forms a cavity 106 extending from the exterior surface 104 into the housing 102 and defines a first slanted interior surface 108, a second slanted interior surface 110, a third slanted interior surface 112, and a fourth slanted interior surface 114.

The cavity 106 includes an opening having a first opening edge 130 and a second edge 131. In one example, the first opening edge is 15 mm and the second opening edge is 10 mm. However, it will be appreciated that other dimensions for the opening edges of the cavity 106 may also be used.

The slanted interior surfaces 108 and 110 extend from the first exterior surface 104 and the slanted interior surfaces 112 and 114 extend from the second exterior surface 105 of the housing 102 and are in a substantially non-perpendicular and angled relation to the exterior surfaces 104 and 105 of the housing 102. In one example, the first slanted interior surface 108, the second slanted interior surface 110, the third slanted interior surface 112, and the fourth slanted interior surface 114 are configured at a 30-45 degree angle with respect to the first exterior surface 104 and second exterior surface 105. However, it will be appreciated that other angles may also be used.

The slanted interior surfaces 108, and 110 extend from the first exterior surface 104 extend to a first interior surface 132. The third and fourth slanted interior surfaces 112 and 114 extend to a second interior surface 133. The first interior surface 132 and second interior surface 133 are formed so as to be substantially perpendicular to the first exterior surface 104 and the second exterior surface 105. In one example, the first interior surface 132 and the second interior surface 133 have a length (across the housing 102) of 15 mm and a thickness of 2 mm. However, it will be understood that other dimensions for the surfaces 132 and 133 can be employed.

Additionally, in the examples described herein, four slanted surfaces are shown and these are configured according to certain angles and dimensions. However, it will be understood that any number of slanted surfaces may be used and the angles, dimensions, sizes, shapes, and other characteristics of these surfaces may vary.

The seal 100 also includes a first electrical lead 118 and a second electrical lead 120 that extend through the housing 102 and have a portion exposed across the cavity 106 therein. The first and second electrical leads 118 and 120 extend from the housing 102 and are configured to be in electrical contact with one or more electrical components encased within an electronic control housing (not shown in FIG. 1). In one example, the housing 120 for the leads 118 and 120 is 1 mm thick and 3 mm wide and is square or rectangular in the cross-section. However, it will be appreciated that the housing may assume other dimensions, shapes, and configurations.

The seal 100 also includes an adhesive material that substantially fills the cavity 106 and surrounds the exposed portion of the electrical leads 118 and 120 within the cavity 106. The adhesive material (shown as a clear material within the cavity 106) may be any number of different materials or combination of materials. For example, the adhesive material may be an epoxy and a fluorocarbon. Other examples of adhesive materials may also be used.

The slanted surfaces 108, 110, 112, and 114 may also take on a number of forms, shapes, configures, angles, patterns, or other characteristics. In another example, the slanted surfaces 108, 110, 112, and 114 are further formed of a plurality of individual step portions. In still another example, the slanted surfaces 108, 110, 112, 114, and 116 are formed with a wave-like pattern. Other examples of configures for the slanted surfaces are possible.

The cavity 106 further defines a first side surface 122 and a second side surface 124 that are in substantially perpendicular relation and in communication with the exterior surfaces 104 and 105 and are in substantially parallel relation to the electrical leads 118 and 120. The side surfaces 122 and 124 are formed of a wave-like pattern. Alternatively, the side surfaces 122 and 124 may be smooth or of some other pattern.

The seal 100 may be placed at different locations. As shown in FIG. 1, the seal 100 is configured to be disposed outside the electronic control housing of the transmission system. However, in other examples, the seal 100 is configured to be disposed to be within the electronic control housing of the transmission system.

Figure 3B:
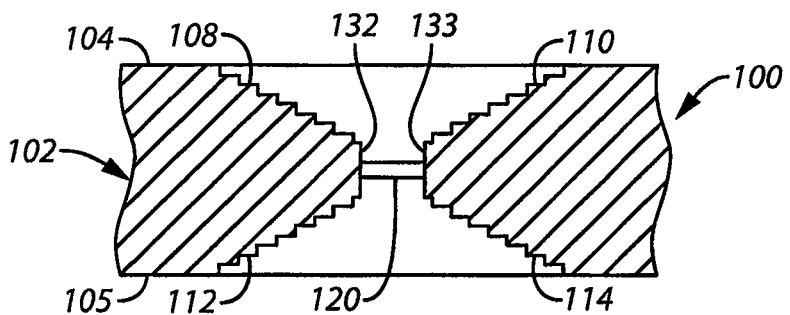
FIGS. 3b and c comprise alternative side cut-way views of the seals of FIGS. 1, 2, and 3a according to various embodiments of the present invention.

Referring now to FIG. 3b, an alternative example of the slanted surfaces of the seal 100 is described. In this example, the slanted surfaces 108, 110, 112, and 114 are stepped rather than smooth. The step structure helps the retention properties of the adhesive that fills the cavity 106.

Figure 3C:
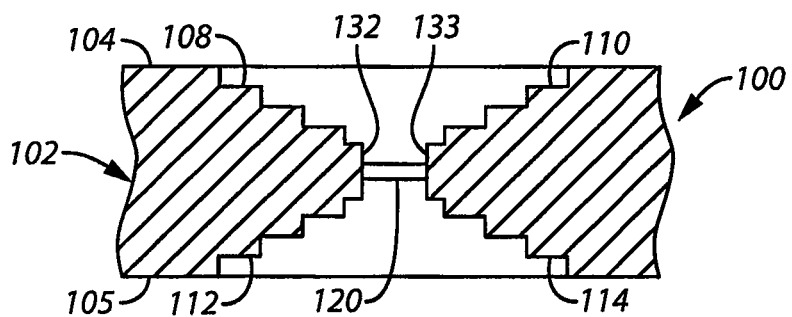

Referring now to FIG. 3c, an alternative example of the slanted surfaces of the seal 100 is described. In this example, the slanted surfaces 108, 110, 112, and 114 are jagged rather than stepped or smooth. The jagged structure helps the retention properties of the adhesive that fills the cavity 106.

It will be appreciated that the approaches described herein ameliorate the effects of thermal stress, friction, and defects within the adhesive material to name a few problems present in previous systems. The slanted surfaces employed within the cavity 106 of the seal 100 in the present approaches eliminate or substantially reduce the chance of tension cracks from developing at the interface between the seal 100 and the electronic housing. Further, the approaches described herein allow more interlocking for the adhesive to be achieved within the cavity 106 and, consequently, eliminate or substantially reduce debonding or delamination of the adhesive.

Figure 4:
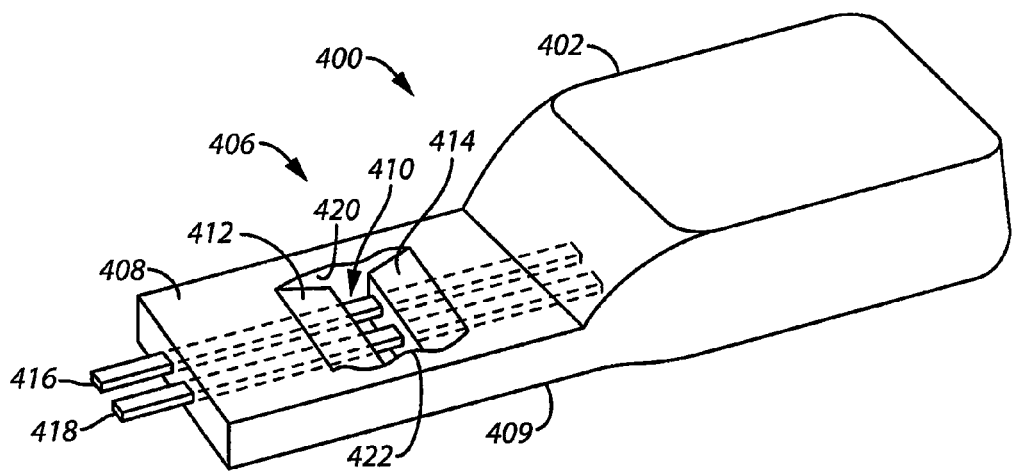
FIG. 4 comprises a perspective view of a transmission assembly according to various embodiments of the present invention.
Figure 5:
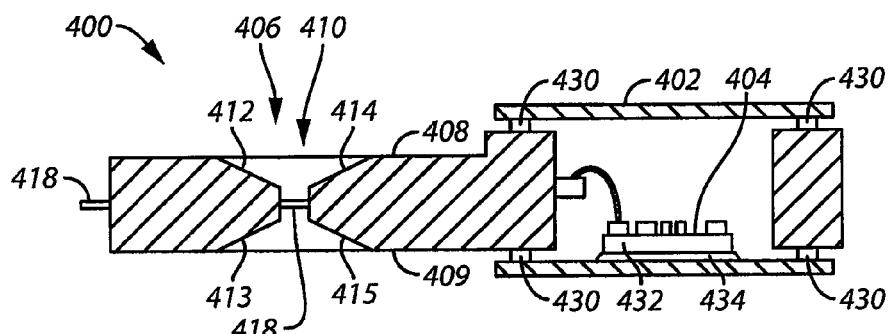
FIG. 5 comprises a side cut-way view of a transmission assembly of FIG. 4 according to various embodiments of the present invention.

Referring now to FIGS. 4 and 5, one example of a transmission assembly 400 includes an electronic control housing 402 and the electronic control housing has electronic control components 404 disposed is described. The assembly 400 also includes a seal 406 that is in communication with the electronic control housing 402. Although the examples described herein are illustrated with an electronic control housing (i.e., a housing electronic components for controlling a transmission), it will be appreciated that the present approaches are applicable to prevent fluid intrusion into housings containing all types of components (e.g., a combination of electronic components and mechanical components or mechanical components only). In other words, the present approaches are not limited to use with housings including only electronic components.

The seal 406 has a first exterior surface 408 and forms a cavity 410 extending into the seal 406. The cavity 410 defines a first slanted interior surface 412 and a second slanted interior surface 414. The slanted interior surfaces 412 and 414 extend from the first exterior surface 408 and are in a substantially non-perpendicular and angular relation to the exterior surface 408. The cavity 410 also defines a third slanted interior surface 413 and a fourth slanted interior surface 415. The slanted interior surfaces 413 and 415 extend from a second exterior surface 409 and are in a substantially non-perpendicular and angular relation to the second exterior surface 409.

The assembly 400 includes a first electrical lead 416 and a second electrical lead 418 that extend through the seal 406 and have a portion exposed across the cavity 410 therein. The first electrical lead 416 and the second electrical lead 418 extend from the seal 406 and are coupled the electronic control components 404. An adhesive material substantially fills the cavity 410 and surrounds the exposed portion of the first electrical lead 416 and the second electrical lead 418 within the cavity 410 of the seal 406.

The electronic control housing 402 also is sealed by O-rings 430. The electronic components 404 may reside on a printed circuit board (PCB) 432, which itself resides on a heat sink 434.

The adhesive material (shown as a clear material within the cavity) may be a variety of different materials. For example, the adhesive material may be an epoxy and a fluorocarbon. Other examples of adhesive materials are possible.

The slanted surfaces may take on a number of forms. In one example, the slanted surfaces are further formed of a plurality of individual step portions. In another example, the slanted surfaces are formed with a wave-like pattern. Other examples of shapes and configurations for the slanted surfaces are possible. In addition, it will be appreciated that the shape and configuration of the slanted surfaces may vary. For example, some of the slanted surfaces may be smooth while others may be of a stepped-shape.

The cavity 410 further defines a first side surface 420 and a second side surface 422 that are in substantially perpendicular relation and in communication with the exterior surfaces 408 and 409 and in substantially parallel relation to the electrical leads 416 and 418. The side surfaces 420 and 422 may be formed of a wave-like pattern. Other examples of configurations of the side surfaces 420 and 422 are possible.

The seal 406 described herein may be placed at different locations. In this example, the seal 406 is configured to be disposed outside of and communicate with the electronic control housing 402 of the transmission system. In other examples, the seal 400 is configured to be disposed within the electronic control housing 402 of the transmission system. Other placements for the seal 406 are possible.

As with the other examples described herein, it will be appreciated that the approaches described herein ameliorate the effects of thermal stress, friction, and defects within the adhesive material to name a few problems present in previous systems. The slanted surfaces employed within the cavity 410 of the seal in the present approaches eliminate or substantially reduce the chance of tension cracks from developing at the interface between the seal 406 and the electronic housing 402. Further, the approaches described herein allow more interlocking for the adhesive to be achieved within the cavity 410 and, consequently, eliminate or substantially reduce debonding or delamination of the adhesive.

Figure 6:
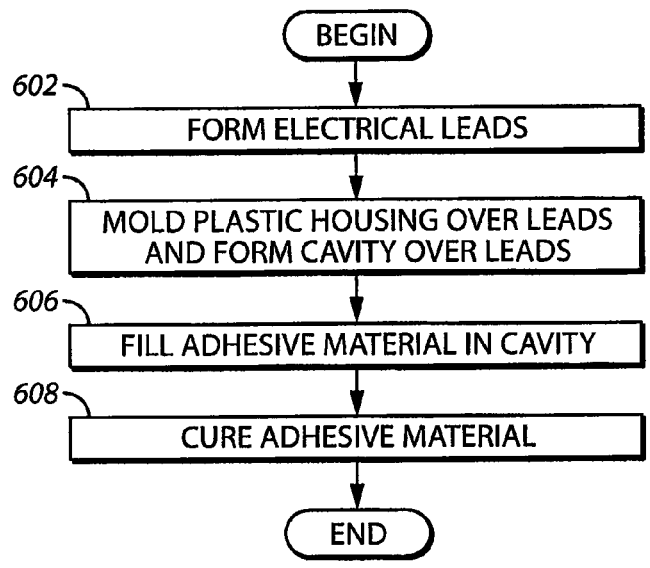
FIG. 6 comprises a flowchart of an approach for forming or manufacturing a seal according to various embodiments of the present invention.

Referring now to FIG. 6, one example of an approach for forming a seal is described. At step 602, electrical leads may be formed. For example, the electrical leads may be formed by any molding, cutting, or extrusion process. In this example, the leads formed are square or rectangular in shape in the cross section. However, other configurations and shapes for the leads are possible.

At step 604, the housing is molded over the leads and forms a cavity. The cavity exposes portions of the leads. The housing may be formed from plastic or some other suitable material. Additionally, the housing may be formed by using a mold or some similar arrangement.

At step 606, the cavity is filled with an adhesive material. This can be accomplished by any method such as injecting or pouring the adhesive material into the cavity. The adhesive may be an epoxy or fluorocarbon. Other examples of adhesives are possible.

At step 608, the adhesive material is cured. For example, the adhesive material may be subjected to heat from an oven or similar arrangement. In one example, the adhesive material is heated at a temperature of 140 degrees Celsius for one hour.

In some examples, the cavity extends completely through the housing. In this case, a block may be placed and secured (e.g., screwed) beneath the housing before filling the cavity is accomplished. The block is used to prevent adhesive from leaking through the cavity during pouring of the adhesive material. In one example, the block is composed of Teflon. However, the block may be composed of other materials as well. After the adhesive is cured, the block is removed.

Thus, seals for electrical leads in electronic transmission systems and approaches for manufacturing these seals are provided. The seals provided herein substantially reduce or eliminate the intrusion of fluids into electronic housings in transmission systems. The approaches described herein are easy to manufacture, cost-effective to implement, and substantially reduce or eliminate fluid intrusion into electronic housings in transmission systems. Consequently, malfunctions or inoperability of electronic components due to fluid intrusion is reduced.

Those skilled in the art will recognize that a wide variety of modifications, alterations, and combinations can be made with respect to the above described embodiments without departing from the spirit and scope of the invention, and that such modifications, alterations, and combinations are to be viewed as being within the scope of the invention.

What is claimed is:

1. A method of manufacturing a seal comprising:
   forming at least one electrical lead;
   molding a housing at least partially around the at least one electrical lead, the housing formed with an exterior surface;
   forming a cavity in the housing, the cavity extending into the housing from the exterior surface, wherein the cavity defines at least one slanted interior surface, the at least one slanted interior surface extending from the exterior surface and being in a substantially non-perpendicular and angled relation to the exterior surface, the cavity formed so as to expose a portion of the at least one electrical lead across the cavity; and
   filling the cavity with an adhesive material, the adhesive material substantially filling the cavity and surrounding the exposed portion of the at least one electrical lead.

2. The method of claim 1 further comprising curing the adhesive material.

3. The method of claim 1 wherein forming the cavity further comprises forming the cavity so as to extend completely through the housing.

4. The method of claim 3 further comprising placing a block beneath the housing before filling the cavity.

5. The method of claim 1 wherein the at least one slanted surface of the cavity of the seal comprises a plurality of individual step portions.

6. The method of claim 1 wherein the at least one slanted surface of the cavity of the seal is formed with a wave-like pattern.

* * * * *